United States Patent [19]

Fitzgerald, Jr.

[11] Patent Number: 5,158,907
[45] Date of Patent: Oct. 27, 1992

[54] METHOD FOR MAKING SEMICONDUCTOR DEVICES WITH LOW DISLOCATION DEFECTS

[75] Inventor: Eugene A. Fitzgerald, Jr., Bridgewater, N.J.

[73] Assignee: AT&T Bell Laboratories, Murray Hill, N.J.

[21] Appl. No.: 561,744

[22] Filed: Aug. 2, 1990

[51] Int. Cl.$^5$ .......................................... H01L 21/20
[52] U.S. Cl. ................................... 437/126; 437/110; 437/132; 437/133; 148/DIG. 42
[58] Field of Search ............... 437/110, 126, 132, 133; 148/DIG. 42

[56] References Cited

U.S. PATENT DOCUMENTS

| | | | |
|---|---|---|---|
| 3,962,716 | 6/1976 | Pétroff et al. | 437/130 |
| 4,088,515 | 5/1978 | Blakeslee et al. | 437/128 |
| 4,370,510 | 1/1983 | Stirn | 136/262 |
| 4,632,712 | 12/1986 | Fan et al. | 437/132 |
| 4,769,341 | 9/1988 | Luryi | 437/132 |
| 4,826,784 | 5/1989 | Salerno et al. | 437/126 |

FOREIGN PATENT DOCUMENTS

| | | |
|---|---|---|
| 62-087490 | 4/1987 | Japan . |
| 1-223718 | 9/1989 | Japan . |
| 2215514 | 9/1989 | United Kingdom . |

OTHER PUBLICATIONS

Choi, et al, "Monolithic Integration of GaAs/AlGaAs Double-Heterostructure LED's and Si MOSFET's" *IEEE Electron Device Letters*, vol. EDL-7, No. 9, Sep. 1986.

Shichijo et al, "Co-Integration of GaAs MESFET and Si CMOS Circuits", *IEEE Electron Device Letters*, vol. 9, No. 9, Sep. 1988.

Choi et al, "Monolithic Integration of GaAs/AlGaAs LED and Si Driver Circuit", *IEEE Electron Device Letters*, vol. 9, No. 10, Oct. 1988 (p. 513).

Smith et al, "A New Infrared Detector Using Electron Emission From Multiple Quantum Wells," *J. Vac. Sci. Technol. B.*, vol. 1, No. 2, Apr.-Jun. 1983.

Levine, et al, "New 10 Micron Infrared Detector Using Intersubband absorption in resonant tunneling GaAlAs superlattices," *Applied Physics Letters*, vol. 50, No. 16, Apr. 20, 1987.

Windhorn et al, "Al GaAs/GaAs Laser Diodes on Si", *Applied Physics Letters*, vol. 47, p. 1031 (1985).

Ettenburg, "Continuous Low Threshold AlGaAs/GaAs Laser", *Applied Physics Letters*, vol. 27, p. 652 (1975).

Fitzgerald, E. A., "In Search of Low-Dislocation-Density Hetero-Epitaxial Structures", *Journal of Metals*, vol. 41, pp. 20-24 (1989).

Fitzgerald, et al, "Nucleation Mechanisms and the Elimination of Misfit Dislocations at Mismatched Interfaces by Reduction in Growth Area", *Journal of Appl. Phys.*, vol. 65, No. 6, Mar. 1989.

Matthews, et al, "Accommodation of Misfit Across the Interface Between Crystals of Semiconducting Elements or Compounds", *Journal of Appl. Phys.*, vol. 41, No. 9, (1970).

C. H. Henry, "Recent Advances in Integrated Optics on Silicon", the Eighth Annual European Fibre Optic Communications and Local Area Networks Conference, Jun. 1990, pp. 11-14.

(List continued on next page.)

*Primary Examiner*—Brian E. Hearn
*Assistant Examiner*—Laura M. Holtzman
*Attorney, Agent, or Firm*—G. E. Books

[57] ABSTRACT

Semiconductor devices having a low density of dislocation defects can be formed of epitaxial layers grown on defective or misfit substrates by making the thickness of the epitaxial layer sufficiently large in comparison to the maximum lateral dimension. With sufficient thickness, threading dislocations arising from the interface will exit the sides of the epitaxial structure and not reach the upper surface. Using this approach, one can fabricate integral gallium arsenide on silicon optoelectronic devices and parallel processing circuits. One can also improve the yield of lasers and photodetectors.

10 Claims, 3 Drawing Sheets

OTHER PUBLICATIONS

D. V. Lang, "Defects and Future Semiconductor Devices", *Materials Science Forum*, vols. 38–41, (1989) pp. 13–24.

J. Narayan et al., "Critical Phenomenon and Segregation Behavior at Interfaces and Subgrain Boundaries", *Journal de Physique*, vol. 49, No. C-5, pp. 731–767, Oct. 1988.

H. L. Tsai et al, "Generation of Misfit Dislocations in GaAs grown on Si", *Applied Physics Letters*, vol. 55, No. 3, Jul. 17, 1989, pp. 265–267.

E. A. Fitzgerald, "The Effect of Substrate Growth Area on Misfit and Threading Dislocation . . ." *J. Vac. Sci. Tech. B*, vol. 7, No. 4, Jul./Aug. 1989, pp. 782–788.

E. A. Fitzgerald et al., "Elimination of Interface Defects in Mismatched Epilayers by a Reduction in Growth Area," *Applied Physics Letters*, vol. 52, No./8, May 2, 1988, pp. 149–158.

H. K. Choi et al., "Monolithic Integrated Circuits of Si MOSFET's and GaAs MESFET's" *IEEE Electron Device Letters*, vol. EDL-7, No. 4, Apr. 1986, pp. 241–243.

METHOD FOR MAKING SEMICONDUCTOR DEVICES WITH LOW DISLOCATION DEFECTS

FIELD OF THE INVENTION

This invention relates to semiconductor devices having a low density of dislocation defects and, in particular, to semiconductor devices comprising limited area epitaxial regions grown on either misfit substrates or substrates having a high density of dislocation defects. It further concerns methods for making and using such devices.

BACKGROUND OF THE INVENTION

A low level of dislocation defects is important in a wide variety of semiconductor devices and processes. Dislocation defects partition an otherwise monolithic crystal structure and introduce unwanted and abrupt changes in electrical and optical properties. Dislocation defects can arise in efforts to epitaxially grow one kind of crystalline material on a substrate of a different kind of material (heterostructures) due to different crystalline lattice sizes of the two materials. Misfit dislocations form at the mismatched interface to relieve the misfit strain. Many misfit dislocations have vertical components, termed threading segments, which terminate at the surface. These threading segments continue through all subsequent layers added. Dislocation defects can also arise in the epitaxial growth of the same material as the substrate (homostructures) where the substrate itself contains dislocations. Some of the dislocations replicate as threading dislocations in the epitaxially grown material. Such dislocations in the active regions of semiconductor devices such as diodes, lasers and transistors, seriously degrade performance.

To avoid dislocation problems, most semiconductor heterostructure devices have been limited to semiconductor layers that have very closely lattice-matched crystal structures. Typically the lattice mismatch is within 0.1%. In such devices a thin layer is epitaxially grown on a mildly lattice mismatched substrate. So long as the thickness of the epitaxial layer is kept below a critical thickness for defect formation, the substrate acts as a template for growth of the epitaxial layer which elastically conforms to the substrate template. While lattice matching and near matching eliminates dislocations in a number of structures, there are relatively few lattice-matched systems with large energy band offsets, limiting the design options for new devices.

There is considerable interest in heterostructure devices involving greater epitaxial layer thickness and greater lattice misfit than present technology will allow. For example, it has long been recognized that gallium arsenide grown on silicon substrates would permit a variety of new optoelectronic devices marrying the electronic processing technology of silicon VLSI circuits with the optical component technology available in gallium arsenide. See, for example, Choi et al, "Monolithic Integration of Si MOSFET's and GaAs MESFET's", *IEEE Electron Device Letters*, Vol. EDL-7, No. 4, April 1986. Highly advantageous results of such a marriage include high speed gallium arsenide circuits combined with complex silicon VLSI circuits and gallium arsenide optoelectronic interface units to replace wire interconnects between silicon VLSI circuits. Progress has been made in integrating gallium arsenide and silicon devices. See, for example, Choi et al, "Monolithic Integration of GaAs/AlGaAs Double-Heterostructure LED's and Si MOSFET's" *IEEE Electron Device Letters*, Vol. EDL-7, No. 9, September 1986; Shichijo et al, "Co-Integration of GaAs MESFET and Si CMOS Circuits", *IEEE Electron Device Letters*, Vol. 9, No. 9, September 1988. However, despite the widely recognized potential advantages of such combined structures and substantial efforts to develop them, their practical utility has been limited by high defect densities in gallium arsenide layers grown on silicon substrates. See, for example, Choi et al, "Monolithic Integration of GaAs/AlGaAs LED and Si Driver Circuit", *IEEE Electron Device Letters*, Vol. 9, No. 10, Oct. 1988 (p. 513). Thus while basic techniques are known for integrating gallium arsenide and silicon devices, there exists a need for producing gallium arsenide layers having a low density of dislocation defects.

There is also considerable interest in growing low defect density gallium arsenide surfaces irrespective of the type of substrate. Gallium arsenide is prone to dislocation defects; and, as a consequence, devices grown on gallium arsenide substrates have a notoriously low yield.

SUMMARY OF THE INVENTION

In contrast with the prior art approach of minimizing dislocation defects by limiting misfit epitaxial layers to less than a critical thickness for elastic conformation to the substrate, the present invention utilizes greater thickness and limited lateral areas to produce limited area regions having upper surfaces exhausted of threading dislocations. Since threading dislocations propagate with a lateral as well as a vertical component, making the thickness sufficiently large in comparison to the lateral dimension permits the threading dislocations to exit the sides of the epitaxial structure. The upper surface is thus left substantially free of defects. As a result, one can fabricate monolithic heterostructure devices, such as gallium arsenide on silicon optoelectronic devices, long sought in the art but heretofore impractical due to dislocation defects. As another embodiment, one can fabricate a monolithic structure using gallium arsenide circuitry to perform high speed processing tasks and silicon VLSI circuitry to perform complex, lower speed tasks. In yet another embodiment, one can fabricate arrays of low defect density devices on a high defect density substrate, substantially improving the yield.

BRIEF DESCRIPTION OF THE DRAWINGS

The advantages, nature and various additional features of the invention will appear more fully upon consideration of the illustrative embodiments now to be described in detail. In the drawings.

It is to be understood that these drawings are for purposes of illustrating the concepts of the invention and are not to scale. Similar structural elements are denoted by the same reference numerals throughout the drawing.

DETAILED DESCRIPTION

Figure 1:
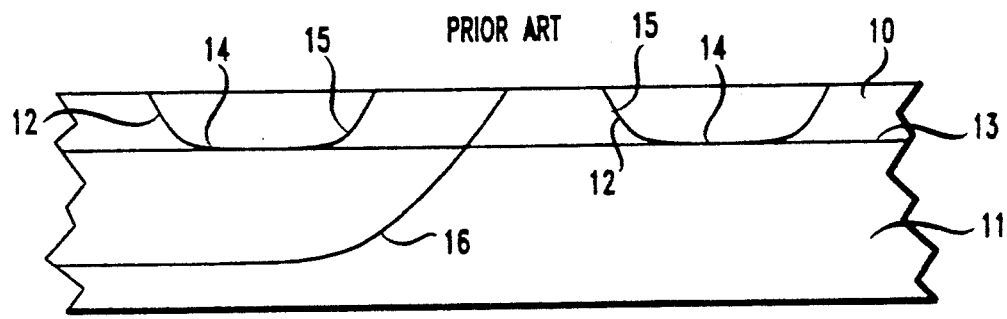
FIG. 1 is a schematic cross section illustrating the problem of threading dislocations addressed by the present invention.

Referring to the drawings, FIG. 1 is a schematic cross section illustrating the problem of threading dislocations resulting from efforts to epitaxially grow a blanket layer 10 of crystalline material on a crystalline substrate 11. As illustrated, dislocation defects 12 form at the interface 13 between layers 10 and 11. Many of these defects 12 have not only horizontal portions 14, termed misfit segments, but also portions with vertical components 15, termed threading segments. Such threading segments can also arise as continuations of pre-existing threading segments 16 in the substrate 11.

Figure 2:
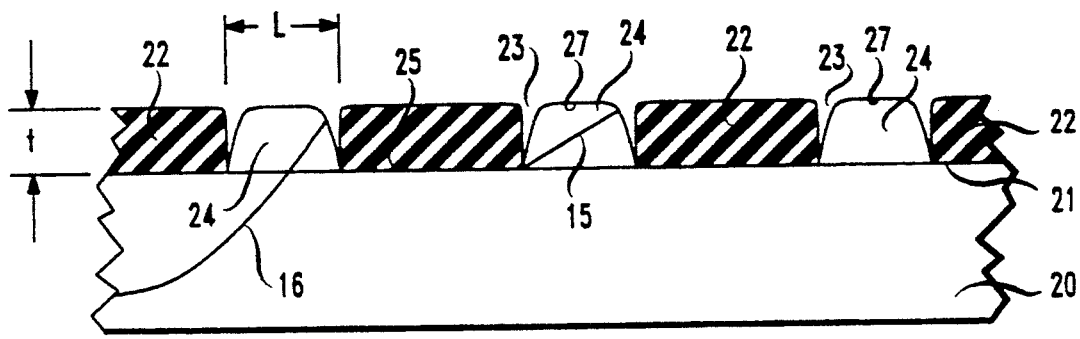
FIG. 2 is a schematic cross section of a first embodiment of a semiconductor workpiece provided with limited area regions of low defect density in accordance with the invention.

FIG. 2 is a schematic cross section of a first embodiment of a semiconductor workpiece provided with limited area regions of low defect density in accordance with the invention. The workpiece comprises a monolithic semiconductor substrate 20 having a major surface 21 covered with an insulating layer 22. The insulating layer includes one or more openings 23, and grown within the openings on substrate 20, one or more limited area epitaxial regions 24 of low defect density semiconductor. The substrate 20 and the low defect region 24 can be different crystalline semiconductors having lattice mismatch in excess of 0.2%.

Because of dislocations or pre-existing threading segments at the interface between substrate 20 and grown regions 24, threading segments 15 and 16 arise from the interface. However each epitaxial region 24 has a thickness t sufficiently large as compared with its maximum lateral extent L that the threading segments exit the sides of regions 24 rather than reaching the upper surfaces 27. The ratio of t/L required to insure exit of threading segments arising from the interface depends on the crystalline orientation of the substrate. A (100) substrate requires a ratio of 1; a (111) substrate requires a ratio of $\sqrt{2}$, and a (110) substrate requires $\sqrt{3}/3$. Ratios of 50% of these values provide a useful level of defect elimination.

In a preferred embodiment, the substrate 20 is (100) monocrystalline silicon, the insulating layer 22 is silicon oxide, and the limited area regions 24 are gallium arsenide. The limited area regions are approximately circular in the lateral surface and preferably have a transverse thickness t at least as great as their maximum lateral dimension L.

This preferred embodiment can be fabricated by growing on a conventional (100) silicon IC wafer 20 a layer of silicon oxide 22 having a thickness preferably in the range from 5 to 100 microns. Conventional photolithography can be used with HF etchant to open windows 23, and gallium arsenide having a thickness greater than or approximately equal to the maximum lateral dimension is deposited on the exposed silicon by MBE with a substrate temperature of 570° C. Preferably the thickness of the silicon oxide and the gallium arsenide are equal in order to produce a co-planar structure as shown in FIG. 2.

Figure 3:
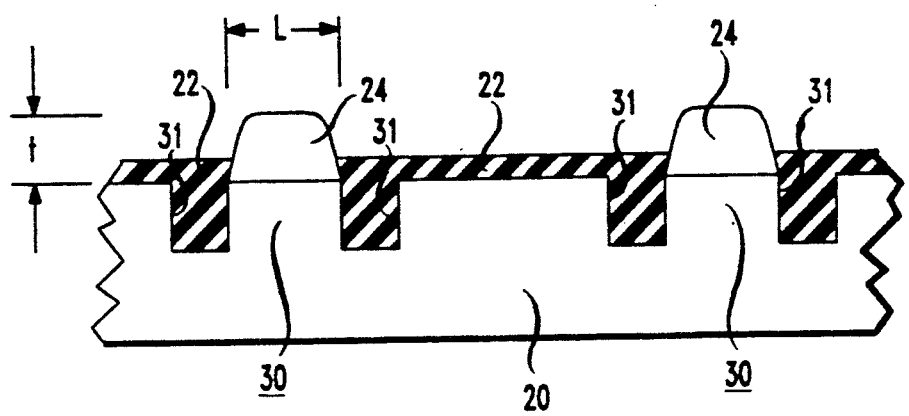
FIG. 3 is a schematic cross section of a second embodiment of a semiconductor workpiece in accordance with the invention.

FIG. 3 is a schematic cross section of a second embodiment of a semiconductor workpiece provided with limited area regions of low defect density. The embodiment is similar to that shown in FIG. 2 except that the substrate 20 is provided with one or more limited area mesa regions 30 upon which the limited area regions 24 of low defect density semiconductor are grown. The mesas are substantially surrounded by trenches 31.

This embodiment can be fabricated by forming on a silicon substrate an aluminum mask which selectively exposes trench regions 31. The masked substrate is then subjected to reactive ion etching to produce trenches 31. The aluminum is removed over the mesas, and a silicon oxide layer is deposited. The silicon oxide over the mesas is selectively removed, and the gallium arsenide region 24, having a thickness preferably in excess of its maximum lateral dimension, is deposited by CVD at a temperature of about 600°–700° C. or by MBE at about 550°–650° C. Any GaAs deposited on the oxide covered areas can be removed by dissolving the underlying silicon oxide in HF. Finally a planarized insulating layer 22, such as silicon oxide can be applied to the non-mesa areas, resulting in the structure shown in FIG. 3.

Figure 4:
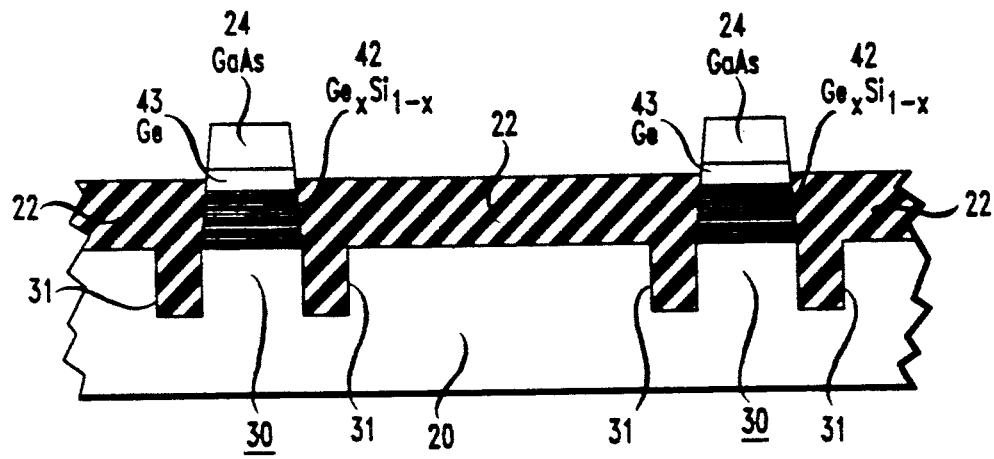
FIG. 4 is a schematic cross section of a third embodiment of the invention.

FIG. 4 is a schematic cross section of a third embodiment of the invention wherein a semiconductor substrate 20 is provided with limited area regions 24 of low defect density by providing a plurality of relaxed, misfitted buffer layers 42 and 43 between the substrate and the low defect layer.

In essence the preferred form of the FIG. 4 embodiment is similar to the preferred form of the FIG. 3 embodiment except that disposed between the upper surface of silicon mesa 30 and limited area gallium arsenide region 24 is a limited area region 42 of germanium silicon alloy $Ge_x Si_{1-x}$ having an upper surface 43 of substantially pure germanium upon which gallium arsenide region 24 is grown. The $Ge_x Si_{1-x}$ region is grown as a limited area region having an area in the range between 25 and 10,000 square microns. The $Ge_x Si_{1-x}$ region 42 has gradient of increasing Ge concentration as the region extends from the mesa 30 to the gallium arsenide layer 24. The advantage of growing this structure in limited area is that a high proportion of threading segments from the interface with substrate 20 can glide out to the sides of the structure. Thus the Germanium surface 43 presents the gallium arsenide layer 24 with a very low defect substrate. If desired, highly effective further filtering can be provided by growing layer 24 in sufficient thickness t in relation to maximum lateral dimension L that threading segments exit the sides.

The workpiece of FIG. 4 can be prepared by etching trenches 31 to define mesas 30, and depositing $Ge_x Si_{1-x}$ onto the mesas by the MBE or CVD processes. The Ge concentration increased linearly with thickness or step graded at a rate in the range between 5% and 0.1% per one thousand angstroms until the concentration of germanium is substantially 100%. The temperature of growth should be greater than about 600° C. For the CVD process the temperature is preferably about 900° C. and for the MBE process, preferably 650°–750° C.

Once the pure germanium concentration is reached, either the GaAs layer can be grown immediately or a Ge buffer layer 43 of about 1000 angstroms can be grown before the GaAs deposition.

Semiconductor workpieces as shown in FIGS. 2, 3 and 4 are highly advantageous in that they present upper surfaces of epitaxial regions 24 that are substantially free of dislocation defects. While the low defect surfaces are limited in area, they present areas of 25 to 10,000 square microns that are large enough to permit fabrication of useful optoelectronic devices and high speed integrated circuits. Primary uses include 1) provision of optical input, optical output and optical interconnections to integrated circuits in the substrate; 2) provision of high speed supplementary circuitry in support of integrated circuits in the substrate; and 3) provision of high yield areas in low yield substrates.

Figure 5:
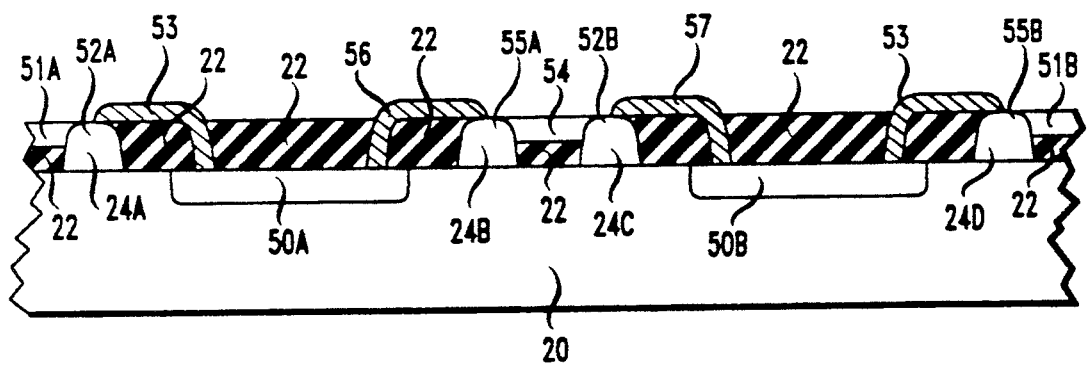
FIG. 5 schematically illustrates the use of the invention to provide optical input, optical interconnections and/or optical output to integrated circuits in the substrate.

FIG. 5 schematically illustrates the use of the invention to provide optical input, optical interconnections and optical output to integrated circuits in the substrate. Specifically, the substrate 20 is preferably a monolithic silicon substrate containing one or more integrated circuits 50A and 50B and one or more limited area, low defect gallium arsenide regions 24A, 24B, 24C and 24D.

Integrated circuit 50A is provided with optical input, as from optical fiber 51A, by forming a photodetector 52A on limited area gallium arsenide region 24A. The optical signal coupled to the photodetector produces an electrical signal coupled to circuit 50A by conformal metal leads 53.

Integrated circuit 50A is provided with optical output, as to optical waveguide 54, by forming a light emitter 55A, such as a LED or laser, on limited area gallium arsenide region 24B. An electrical signal from circuit 50A is coupled to light emitter 55A by metal leads 56. The light emitter, in turn, produces a modulated optical output signal coupled by waveguide 54 to a second photodetector 52B formed on limited area region 24C. The electrical output of 52B is coupled to a second integrated circuit 50B by metal leads 57. Thus integrated circuits 50A and 50B are provided with optical interconnections.

As illustrated, the system can similarly be provided with an optical output as by a second light emitter 55B formed on limited area region 24D. An electrical output signal from circuit 50B over leads 53 causes emitter 55B to produce an optical output signal coupled into optical fiber 51B.

The integrated circuits 50A and 50B can be any of a large number of known silicon VLSI circuits useful, for example, in processing serial digital signals. The structure and fabrication of such circuits is well known in the art.

Limited area gallium arsenide regions 24A, 24B, 24C, and 24D can be fabricated on substrate 20 after formation of integrated circuits 50A and 50B without significantly deteriorating the underlying integrated circuits. MBE at 550°-650° C. is particularly advantageous because of the low deposition temperatures. Photodetectors 52A and 52B can be formed on regions 24A and 24C in accordance with one of a variety of known methods of forming photodetectors on gallium arsenide substrates. See, for example, the photodetectors disclosed in Smith et al, "A New Infrared Detector Using Electron Emission From Multiple Quantum Wells," *J. Vac. Sci. Technol. B*, Vol. 1, No. 2, April-June 1983 and Levine et al, "New 10 Micron Infrared Detector Using Intersubband Absorption In Resonant Tunneling GaAlAs Superlattices," *Applied Physics Letters*, Vol. 50, No. 16, Apr. 20, 1987. Similarly light emitters 55A and 55B can be formed on regions 24B and 24D in accordance with one of a variety of known methods for forming LED's or lasers on gallium arsenide substrates. See, for example, Windhorn et al, "AlGaAs/GaAs Laser Diodes on Si", *Applied Physics Letters*, Vol. 47, p. 1031 (1985); Ettenburg, "Continuous Low Threshold AlGaAs/GaAs Laser", *Applied Physics Letters*, Vol. 27, p. 652 (1975), or the previously cited Choi et al articles. Waveguide 54 can be polymer, silicon oxide, or glass. Preferably it is a phosphosilicate glass waveguide such as described in Henry, "Recent Advances in Integrated Optics on Silicon", Proceedings of Eighth Annual European Fiber Optic Communications and Local Area Networks Conference, Jun. 27-29, 1990.

Figure 6:
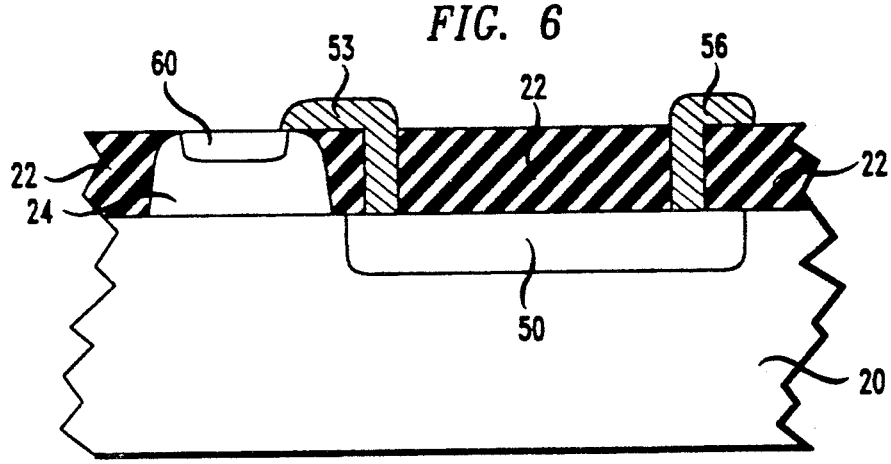
FIG. 6 schematically illustrates the use of the invention to provide a supplementary high speed circuit to an integrated circuit in the substrate.

FIG. 6 schematically illustrates the use of the invention to provide a supplementary high-speed circuit to an integrated circuit in the substrate. Here, as above, the substrate 20 is preferably a monolithic silicon substrate containing one or more integrated circuits 50 and one or more limited area, low defect density gallium arsenide regions 24. The primary difference between this embodiment and that of FIG. 5 is that in FIG. 6 the regions 24 is sufficiently large to contain a small integrated circuit 60 rather than only a device. For example, a limited area region 24 having dimensions $50 \times 50 \times 50$ microns is sufficiently large to contain the GaAs MESFET Circuit described in Shichijo, et al, "Co-Integration of GaAs MESFET and Si CMOS Circuits", *IEEE Electron Device Letters*, Vol. 9, No. 9, September 1988. The silicon integrated circuit 50 can be CMOS inverter stages. The combination can form a ring oscillator. The advantage of using limited area regions 24 in accordance with the invention is lower defects in the gallium arsenide with resulting higher yield and improved performance.

Figure 7:
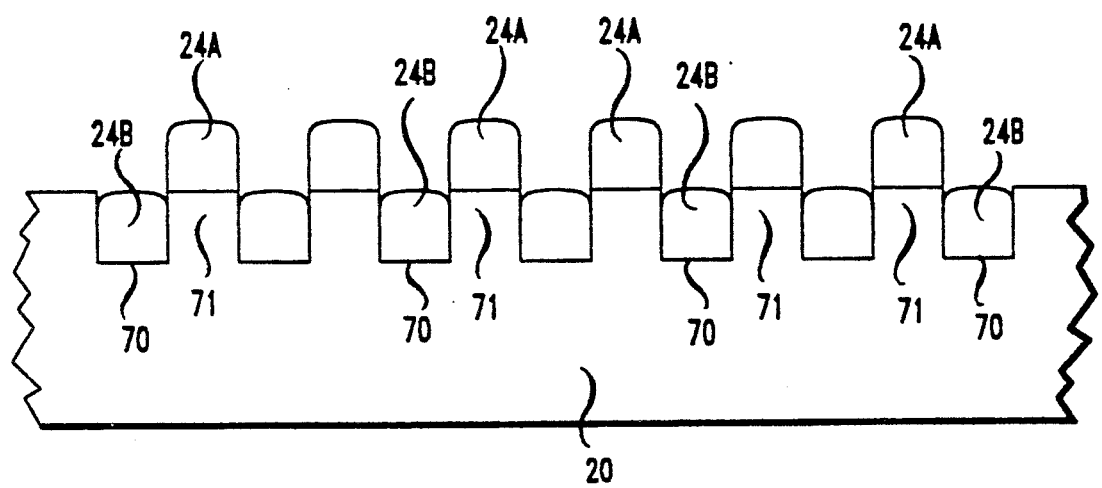
FIG. 7 schematically illustrates the use of the invention to provide arrays of low defect density regions on a high defect density substrate.

FIG. 7 schematically illustrates the use of the invention to provide arrays of low defect density regions integrally formed on a high defect density substrate. Here substrate 20 is a monolithic crystalline substrate having a level of defect density sufficiently large to preclude high yield or to limit desired quality of devices formed on the substrate. For example, substrate 20 can be gallium arsenide having a defect density in excess of about $10^3$ cm$^{-2}$.

As a preliminary step, substrate 20 is etched, as by reactive ion etching, to form a sequence of pits 70 and mesas 71. Gallium arsenide is deposited as by MBE to form low defect regions 24A on the mesas 30, and low defect regions 24B can be simultaneously formed in the pits. By growing the gallium arsenide sufficiently thick as compared with its maximum lateral dimension, the regions 24A and 24B are provided with upper surfaces substantially free of defects. The resulting structure can be used to fabricate on the upper surfaces of regions 24A and 24B, arrays of devices such as photodetectors and lasers, having reduced defects and resulting higher yield and performance.

It is to be understood that the above-described embodiments are illustrative of only a few of the many possible specific embodiments which can represent applications of the principles of the invention. Numerous and varied other arrangements can be readily devised in accordance with these principles by those skilled in the art without departing from the spirit and scope of the invention.

I claim:

1. A method for making a semiconductor device having one or more limited area regions with low defect density semiconductor surfaces comprising the steps of:

providing a monocrystalline semiconductor substrate;

epitaxially growing on said semiconductor substrate one or more limited area regions of semiconductor material having a maximum lateral dimension L and a thickness t, the ratio t/L being in excess of $\sqrt{3}/3$ so that threading dislocations arising from the interface between said limited area regions and said substrate exit at lateral side surfaces of said limited area regions.

2. The method of claim 1 further comprising the step of etching one or more pit regions in said substrate; and wherein said limited area regions are grown in said pit regions.

3. The method of claim 1 further comprising the step of forming on said substrate one or more mesa regions on said substrate; and wherein said limited area regions are grown on said mesa regions.

4. The method of claim 1 further comprising the steps of a) providing said substrate with a layer of insulating material, and b) etching in said insulating layer one or more pit regions to said substrate; and wherein said limited area regions are grown in said pit regions.

5. The method of claim 1 further comprising the steps of a) providing said substrate with a layer of insulating material of thickness substantially equal to the thickness to which said limited area regions are to be grown, and b) etching in said insulating material one or more pit regions to said substrate; and wherein said limited area regions are grown in said pit regions.

6. The method of claim 1 wherein said substrate is of a first crystalline material and said limited area regions are of a second crystalline material, said first and second materials having a lattice mismatch in excess of about 0.2%.

7. The method of claim 1 wherein said substrate comprises silicon and said limited area regions comprise gallium arsenide.

8. The method of claim 1 wherein said substrate has a density of dislocation defects in excess of about $10^3$ per $cm^2$ and said limited area regions are comprised of the same semiconductor material as said substrate.

9. A method for making a semiconductor device having one or more limited area regions with low defect density semiconductor surfaces comprising the steps of:

providing a monocrystalline silicon substrate;

epitaxially growing on said silicon substrate one or more limited area regions of $Ge_xSi_{1-x}$ having respective areas in the range between 25 and 10,000 square microns and having a graded concentration of Germanium increasing to about 100%; and epitaxially growing on said $Ge_xSi_{1-x}$ regions respective limited area regions of gallium arsenide having a thickness sufficiently large as compared with the maximum lateral dimension that threading dislocations arising from the GaAs-Ge interface exit at lateral side surfaces.

10. The method of claim 9 wherein the concentration of germanium in said $Ge_xSi_{1-x}$ is graded at a rate in the range between 5% and 0.1% per one thousand angstroms.

* * * * *